US012111337B2

(12) United States Patent
Bauer (10) Patent No.: US 12,111,337 B2
(45) Date of Patent: Oct. 8, 2024

(54) CONSTRUCTIVE SYSTEM REGARDING A CAPACITIVE SENSOR

(71) Applicant: G & W ELECTRIC COMPANY, Bolingbrook, IL (US)

(72) Inventor: Alberto Bauer, Dubai (AE)

(73) Assignee: G & W ELECTRIC COMPANY, Bolingbrook, IL (US)

( * ) Notice: Subject to any disclaimer, the term of this patent is extended or adjusted under 35 U.S.C. 154(b) by 0 days.

(21) Appl. No.: 18/506,651

(22) Filed: Nov. 10, 2023

(65) Prior Publication Data

US 2024/0077520 A1 Mar. 7, 2024

Related U.S. Application Data

(63) Continuation of application No. 18/149,561, filed on Jan. 3, 2023, now Pat. No. 11,815,529, which is a
(Continued)

(30) Foreign Application Priority Data

Mar. 30, 2018 (IT) .......................... 102018000004114

(51) Int. Cl.
  *G01R 15/16* (2006.01)
  *G01R 19/00* (2006.01)
  *G01R 15/14* (2006.01)

(52) U.S. Cl.
  CPC ........... *G01R 15/16* (2013.01); *G01R 15/165* (2013.01); *G01R 19/0084* (2013.01); *G01R 15/142* (2013.01)

(58) Field of Classification Search
  CPC ........ G01R 15/00; G01R 15/04; G01R 15/06; G01R 15/12; G01R 15/14; G01R 15/142;
  (Continued)

(56) References Cited

U.S. PATENT DOCUMENTS 3,396,339 A  8/1968 Miram
3,835,353 A  9/1974 Hermstein et al.
(Continued)

FOREIGN PATENT DOCUMENTS

CN  101605292 A  12/2009
CN  104160283 A  11/2014
(Continued)

OTHER PUBLICATIONS

International Preliminary Report on Patentability for Application No. PCT/IT2019/000023 dated Oct. 15, 2020 (7 pages).
(Continued)

*Primary Examiner* — Hoai-An D. Nguyen
(74) *Attorney, Agent, or Firm* — Michael Best & Friedrich LLP (57) ABSTRACT

A capacitive voltage sensor assembly includes a first electrode extending along a longitudinal axis, a tubular section surrounding a portion of the first electrode and positioned radially outward from the longitudinal axis and the first electrode, the tubular section including an insulating layer, an inner conductive layer, and an outer conductive layer, and a mass of dielectric insulating material at least partially enclosing the first electrode and the tubular section. The mass of dielectric insulating material fills through openings formed in the tubular section.

20 Claims, 5 Drawing Sheets

Related U.S. Application Data continuation of application No. 17/031,021, filed on Sep. 24, 2020, now Pat. No. 11,543,436, which is a continuation of application No. PCT/IT2019/000023, filed on Mar. 19, 2019.

(58) Field of Classification Search
CPC .... G01R 15/144; G01R 15/146; G01R 15/16; G01R 15/165; G01R 19/00; G01R 19/0084; G01R 19/0092; G01R 27/00; G01R 27/02; G01R 27/08
USPC ...... 324/76.11, 126, 522, 713; 702/1, 57, 64
See application file for complete search history.

(56) References Cited

U.S. PATENT DOCUMENTS

| | | | |
|---|---|---|---|
| 4,241,373 | A | 12/1980 | Mara et al. |
| 4,268,889 | A | 5/1981 | Wolfendale |
| 4,700,123 | A | 10/1987 | Beling |
| 5,136,241 | A | 8/1992 | Blank et al. |
| 5,661,240 | A | 8/1997 | Kemp |
| 5,991,177 | A | 11/1999 | Kaczkowski |
| 6,252,388 | B1 | 6/2001 | Jaeger et al. |
| 6,307,385 | B1 | 10/2001 | Tardif et al. |
| 6,396,264 | B1 | 5/2002 | Tamaki et al. |
| 7,466,146 | B2 | 12/2008 | Stewart et al. |
| 7,541,816 | B1 | 6/2009 | Liao et al. |
| 7,595,648 | B2 | 9/2009 | Ungaretti et al. |
| 8,242,840 | B2 | 8/2012 | Van Veldhoven |
| 8,283,934 | B2 | 10/2012 | Nishizono |
| 8,294,477 | B2 | 10/2012 | Handshoe et al. |
| 8,446,157 | B2 | 5/2013 | Fröjd |
| 8,847,353 | B2 | 9/2014 | Hasunuma |
| 9,118,330 | B2 | 8/2015 | Beyly et al. |
| 9,291,651 | B2 | 3/2016 | Bauer |
| 9,389,246 | B2 | 7/2016 | Juds et al. |
| 9,568,506 | B2 | 2/2017 | Fujinoki |
| 9,696,348 | B2 | 7/2017 | Juds et al. |
| 9,739,807 | B2 | 8/2017 | Barba Jimenez |
| 9,739,816 | B2 | 8/2017 | Flanagan |
| 9,739,820 | B2 | 8/2017 | Gravermann et al. |
| 9,742,180 | B2 | 8/2017 | Wentzel et al. |
| 9,846,024 | B1 | 12/2017 | Noras |
| 9,921,246 | B2 | 3/2018 | Bauer |
| 9,927,415 | B2 | 3/2018 | Baumann et al. |
| 9,958,505 | B2 | 5/2018 | Honda |
| 9,983,032 | B1 | 5/2018 | Kraver et al. |
| 10,025,423 | B2 | 7/2018 | Aas et al. |
| 10,088,963 | B2 | 10/2018 | Otagaki et al. |
| 10,203,814 | B2 | 2/2019 | Ryynanen et al. |
| 10,215,778 | B2 | 2/2019 | Gravermann et al. |
| 10,317,442 | B2 | 6/2019 | Kawaguchi et al. |
| 10,338,103 | B2 | 7/2019 | Gravermann et al. |
| 10,345,340 | B2 | 7/2019 | Gravermann et al. |
| 10,425,079 | B1 | 9/2019 | Bytheway |
| 10,591,523 | B2 | 3/2020 | Pak et al. |
| 10,753,962 | B2 | 8/2020 | Testa et al. |
| 10,790,822 | B2 | 9/2020 | Wendt et al. |
| 11,048,367 | B2 | 6/2021 | Reynolds et al. |
| 11,079,410 | B2 | 8/2021 | Bauer et al. |
| 11,287,456 | B2 | 3/2022 | Wang et al. |
| 11,340,266 | B2 | 5/2022 | Bauer |
| 11,346,876 | B2 | 5/2022 | Bauer |
| 11,378,594 | B2 | 7/2022 | Djogo |
| 11,415,611 | B2 | 8/2022 | Zhang et al. |
| 11,774,481 | B2 * | 10/2023 | Bauer .................. G01R 29/12 324/76.11 |
| 2001/0048308 | A1 | 12/2001 | Potter et al. |
| 2002/0113596 | A1 | 8/2002 | Horie et al. |
| 2005/0122118 | A1 | 6/2005 | Zank et al. |
| 2006/0033508 | A1 | 2/2006 | Lee |
| 2006/0119369 | A1 | 6/2006 | Kawahata et al. |
| 2006/0238233 | A1 | 10/2006 | Kraus |
| 2007/0086130 | A1 | 4/2007 | Sorensen |
| 2008/0011093 | A1 | 1/2008 | Shank et al. |
| 2010/0107775 | A1 | 5/2010 | Wang et al. |
| 2010/0283487 | A1 | 11/2010 | Juds et al. |
| 2010/0318306 | A1 | 12/2010 | Tierney et al. |
| 2011/0012623 | A1 | 1/2011 | Gastel et al. |
| 2011/0121820 | A1 | 5/2011 | Handshoe et al. |
| 2011/0121842 | A1 | 5/2011 | Bauer et al. |
| 2011/0204879 | A1 | 8/2011 | Peretto |
| 2011/0205683 | A1 | 8/2011 | Peretto |
| 2011/0221452 | A1 | 9/2011 | Shyue |
| 2011/0234311 | A1 | 9/2011 | Hirashiki et al. |
| 2011/0298454 | A1 | 12/2011 | Ausserlechner |
| 2012/0261384 | A1 | 10/2012 | Labianco et al. |
| 2012/0326734 | A1 | 12/2012 | Cho et al. |
| 2013/0043891 | A1 | 2/2013 | Handshoe et al. |
| 2013/0127675 | A1 | 5/2013 | Mallat et al. |
| 2014/0300374 | A1 | 10/2014 | Mckenzie et al. |
| 2014/0354302 | A1 | 12/2014 | Lu et al. |
| 2014/0370741 | A1 | 12/2014 | Bolcato et al. |
| 2015/0279642 | A1 | 10/2015 | Prance |
| 2015/0346907 | A1 | 12/2015 | Nakajima et al. |
| 2016/0005511 | A1 | 1/2016 | Gravermann et al. |
| 2016/0061864 | A1 | 3/2016 | White et al. |
| 2016/0103174 | A1 | 4/2016 | Aaltonen et al. |
| 2016/0139181 | A1 | 5/2016 | Gravermann et al. |
| 2016/0202286 | A1 | 7/2016 | Aaltonen et al. |
| 2016/0245845 | A1 | 8/2016 | Bauer |
| 2017/0030946 | A1 | 2/2017 | Gravermann et al. |
| 2017/0038414 | A1 | 2/2017 | Barba Jimenez |
| 2017/0061187 | A1 | 3/2017 | Wen |
| 2017/0067938 | A1 | 3/2017 | Kasai |
| 2017/0067939 | A1 | 3/2017 | Imai et al. |
| 2017/0097382 | A1 | 4/2017 | Bickford et al. |
| 2017/0184634 | A1 | 6/2017 | Wentzel |
| 2017/0234908 | A1 | 8/2017 | Gravermann et al. |
| 2017/0248731 | A1 | 8/2017 | Bhongale et al. |
| 2017/0250499 | A1 | 8/2017 | Sica et al. |
| 2017/0276723 | A1 | 9/2017 | Buffa et al. |
| 2017/0363660 | A1 | 12/2017 | Gravermann |
| 2018/0092557 | A1 | 4/2018 | Bickford et al. |
| 2018/0100878 | A1 | 4/2018 | Pearce et al. |
| 2018/0292435 | A1 | 10/2018 | Wentzel et al. |
| 2018/0307314 | A1 | 10/2018 | Connor |
| 2018/0374644 | A1 | 12/2018 | Stollwerck et al. |
| 2019/0146006 | A1 | 5/2019 | Sanchez Ruiz et al. |
| 2019/0181860 | A1 | 6/2019 | Cholasta |
| 2019/0234995 | A1 | 8/2019 | Peretto |
| 2019/0237260 | A1 | 8/2019 | Stollwerck et al. |
| 2019/0324073 | A1 | 10/2019 | Mikami |
| 2020/0064376 | A1 | 2/2020 | Loyd et al. |
| 2020/0124642 | A1 | 4/2020 | Djogo |
| 2020/0158762 | A1 | 5/2020 | Wilson et al. |
| 2020/0200936 | A1 | 6/2020 | Kruger |
| 2020/0256896 | A1 | 8/2020 | Bauer et al. |
| 2021/0072289 | A1 | 3/2021 | Peretto et al. |
| 2021/0206418 | A1 | 7/2021 | Nakano et al. |
| 2021/0302478 | A1 | 9/2021 | Kapoor et al. |
| 2021/0356499 | A1 | 11/2021 | Ferraro et al. |
| 2021/0359533 | A1 | 11/2021 | Hatano |
| 2022/0043033 | A1 | 2/2022 | Bauer |
| 2022/0065910 | A1 | 3/2022 | Ellis, Jr. et al. |
| 2022/0123748 | A1 | 4/2022 | Willis et al. |
| 2022/0311441 | A1 | 9/2022 | Liu |
| 2022/0317158 | A1 | 10/2022 | Stollwerck et al. |

FOREIGN PATENT DOCUMENTS

| | | |
|---|---|---|
| CN | 105372516 A | 3/2016 |
| CN | 105467187 B | 5/2018 |
| DE | 2149881 A1 | 2/1973 |
| DE | 19613688 A1 | 10/1997 |
| DE | 102017000723 A1 | 8/2018 |
| EP | 0677747 A2 | 10/1995 |
| EP | 0912902 A1 | 5/1999 |
| EP | 2366108 B1 | 8/2012 |
| EP | 2993480 A1 | 3/2016 |
| EP | 3828553 A1 | 6/2021 |
| EP | 3840135 A1 | 6/2021 |
| EP | 3862760 A1 | 8/2021 |
| EP | 3913379 A1 | 11/2021 |

(56) References Cited

FOREIGN PATENT DOCUMENTS

| | | |
|---|---|---|
| EP | 3881085 A4 | 7/2022 |
| EP | 4058815 A1 | 9/2022 |
| ES | 2221551 A1 | 12/2004 |
| GB | 967853 A | 8/1964 |
| GB | 2203557 A | 10/1988 |
| WO | 2010070693 A1 | 6/2010 |
| WO | 2011125725 A1 | 10/2011 |
| WO | 2011157047 A8 | 1/2013 |
| WO | 2013026423 A1 | 2/2013 |
| WO | 2017050039 A1 | 3/2017 |
| WO | 2017050042 A1 | 3/2017 |
| WO | 2017050044 A1 | 3/2017 |
| WO | 2017050045 A1 | 3/2017 |
| WO | 2017050058 A1 | 3/2017 |
| WO | 2018069949 A2 | 4/2018 |
| WO | 2018096567 A2 | 5/2018 |
| WO | 2018114661 A1 | 6/2018 |
| WO | 2019073497 A1 | 4/2019 |
| WO | 2020109283 A2 | 6/2020 |
| WO | 2020131903 A1 | 6/2020 |
| WO | 2020131909 A1 | 6/2020 |
| WO | 2021180642 A1 | 9/2021 |
| WO | 2022069967 A1 | 4/2022 |
| WO | 2022072130 A1 | 4/2022 |
| WO | 2022094645 A1 | 5/2022 |
| WO | 2022124942 A1 | 6/2022 |

OTHER PUBLICATIONS

International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).
International Search Report and Written Opinion and Application No. PCT/US2019/066906 dated Mar. 18, 2020 (7 pages).
International Search Report and Written Opinion for Application No. PCT/IT2019/000023 dated Jul. 26, 2019 (9 pages).
International Search Report and Written Opinion for Application No. PCT/US2019/053525 dated Jun. 29, 2020 (12 pages).
International Search Report and Written Opinion for Application No. PCT/US2019/066899 dated Mar. 5, 2020 (10 pages).

\* cited by examiner

CONSTRUCTIVE SYSTEM REGARDING A CAPACITIVE SENSOR

CROSS-REFERENCE TO RELATED APPLICATIONS

This application is a continuation of U.S. patent application Ser. No. 18/149,561, filed Jan. 3, 2023, issued as U.S. Pat. No. 11,815,529, which is a continuation of U.S. patent application Ser. No. 17/031,021, filed Sep. 24, 2020, issued as U.S. Pat. No. 11,543,436, which is a continuation of International Application No. PCT/IT2019/000023, filed on Mar. 19, 2019, which claims priority to Italian Patent Application No. 102018000004114, filed Mar. 30, 2018, the entire contents of all of which are incorporated herein by reference.

FIELD OF THE INVENTION

The present invention relates to a constructive system regarding a capacitive voltage sensor, wherein said sensor is able to detect the electric field generated by a voltage element of the same capacitive sensor, in order, for example, to be able to estimate the value of the voltage of said live element.

More particularly, the present invention relates to a constructive system regarding a capacitive voltage sensor, wherein said sensor provides for detecting the electric field generated by the voltage element of the same sensor without undergoing the influence of any surrounding electric and/or magnetic fields, such as, for example, electro/magnetic fields generated by other conductors and/or other bars arranged nearby.

BACKGROUND

Currently the current capacitive voltage sensors have a series of drawbacks.

A first drawback is due to the fact that the resin dielectric material arranged around the components of the sensor includes vacuoles (air bubbles) with consequent phenomena of undesired partial discharges.

A second drawback is due to the fact that the same resin is detached with respect to the elements that make up the capacitive sensor with consequent phenomena of undesired partial discharges.

A third drawback is due to the fact that the aforementioned resin is not perfectly adherent and/or not perfectly clinging and/or constrained with respect to the elements making up the capacitive sensor and, therefore, as a result of aging, detachments take place between said resin and the aforementioned elements, with consequent phenomena of unwanted partial discharges. This drawback is particularly present when the capacitive sensor is used in an environment where the operating temperature (hot/cold) varies cyclically.

A fourth drawback is due to the fact that the components that make up the sensors are expensive to make.

A fifth drawback is due to the fact that the components that form the sensors after their correct positioning can move during the subsequent assembly or transport operations that take place before the resin is poured, with consequent realization of a non-conforming product and/or of a product to be discarded.

SUMMARY

In some aspects, the techniques described herein relate to a capacitive voltage sensor assembly including: an electrode extending along a longitudinal axis; a tubular section extending along the longitudinal axis and at least partially surrounding the electrode such that the tubular section is radially spaced from the electrode, the tubular section including a first layer made of an electrically insulating material, the first layer having a first plurality of through openings including a first row of circumferentially spaced through openings and a second row of circumferentially spaced through openings and each through opening of the first row is aligned with a through opening of the second row in a direction parallel to the longitudinal axis, a second layer made of an electrically conductive material disposed on an inner surface of the first layer, the second layer having a second plurality of through openings including a first row of circumferentially spaced through openings and a second row of circumferentially spaced through openings and each through opening of the first row is aligned with a through opening of the second row in a direction parallel to the longitudinal axis, and a third layer made of an of electrically conductive material disposed on an outer surface of the first layer, the third layer having a third plurality of through openings including a first row of circumferentially spaced through openings and a second row of circumferentially spaced through holes and each through opening of the first row is aligned with a through opening of the second row in a direction parallel to the longitudinal axis; and a mass of dielectric material at least partially enclosing the electrode and the tubular section, wherein the mass of dielectric insulating material fills through openings in the tubular section, wherein each through opening of the second plurality of through openings is circumferentially aligned with a through opening of the third plurality of through openings.

In some aspects, the techniques described herein relate to a capacitive voltage sensor assembly including: an electrode extending along a longitudinal axis; a tubular section extending along the longitudinal axis and at least partially surrounding the electrode such that the tubular section is radially spaced from the electrode, the tubular section including a first layer made of an electrically insulating material, the first layer having a first plurality of slits circumferentially spaced around the tubular section, wherein each slit of the first plurality of slits extends in a direction parallel to the longitudinal axis, a second layer made of an electrically conductive material disposed on an inner surface of the first layer, the second layer having a second plurality of slits circumferentially spaced around the tubular section, wherein each slit of the second plurality of slits extends in a direction parallel to the longitudinal axis, and a third layer made of an of electrically conductive material disposed on an outer surface of the first layer, the third layer having a third plurality of slits circumferentially spaced around the tubular section, wherein each slit of the third plurality of slits extends in a direction parallel to the longitudinal axis; and a mass of dielectric material at least partially enclosing the electrode and the tubular section, wherein the mass of dielectric insulating material fills slits in the tubular section, wherein each slit of the second plurality of slits is circumferentially aligned with a slit of the third plurality of slits.

In some aspects, the techniques described herein relate to a capacitive voltage sensor assembly including: a source electrode extending along a longitudinal axis; a tubular section extending along the longitudinal axis and at least partially surrounding the source electrode such that the tubular section is radially spaced from the source electrode, the tubular section including a first layer made of an electrically insulating material, the first layer having a first plurality of through openings, a second layer made of an electrically conductive material disposed on an inner surface of the first layer, the second layer having a second plurality of through openings, wherein the second layer is configured to form a capacitive coupling with the source electrode, and a shield configured to shield the capacitive coupling from external electric fields; and a mass of dielectric material at least partially enclosing the source electrode and the tubular section, wherein each through opening of the first plurality of through openings is aligned with a through opening of the second plurality of through openings.

Other features and aspects of the invention will become apparent by consideration of the following detailed description and accompanying drawings.

BRIEF DESCRIPTION OF THE DRAWINGS

Further features and advantages of the present invention will be more evident from the following description of some of its preferred practical embodiments, given here purely by way of non-limiting example, made with reference to the figures of the enclosed drawings in which.

DETAILED DESCRIPTION

Figure 1:
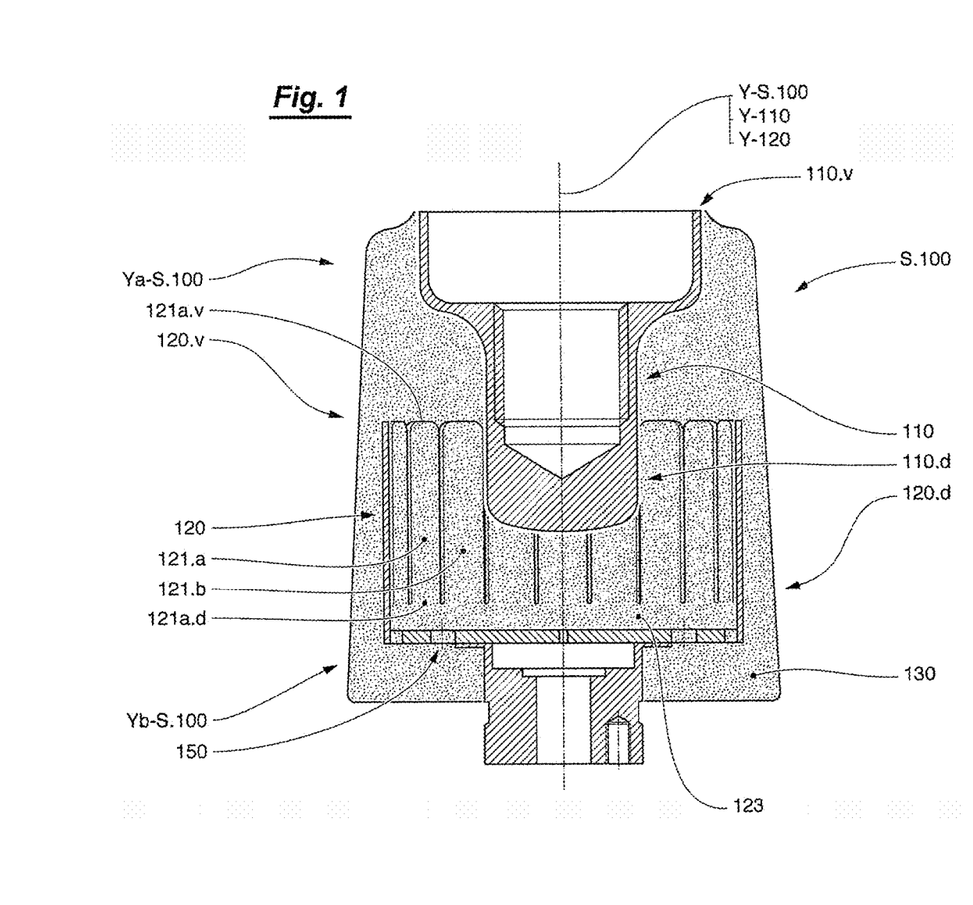
FIG. 1 shows schematically and in axial section a first embodiment of the constructive system object of the present invention.
Figure 2:
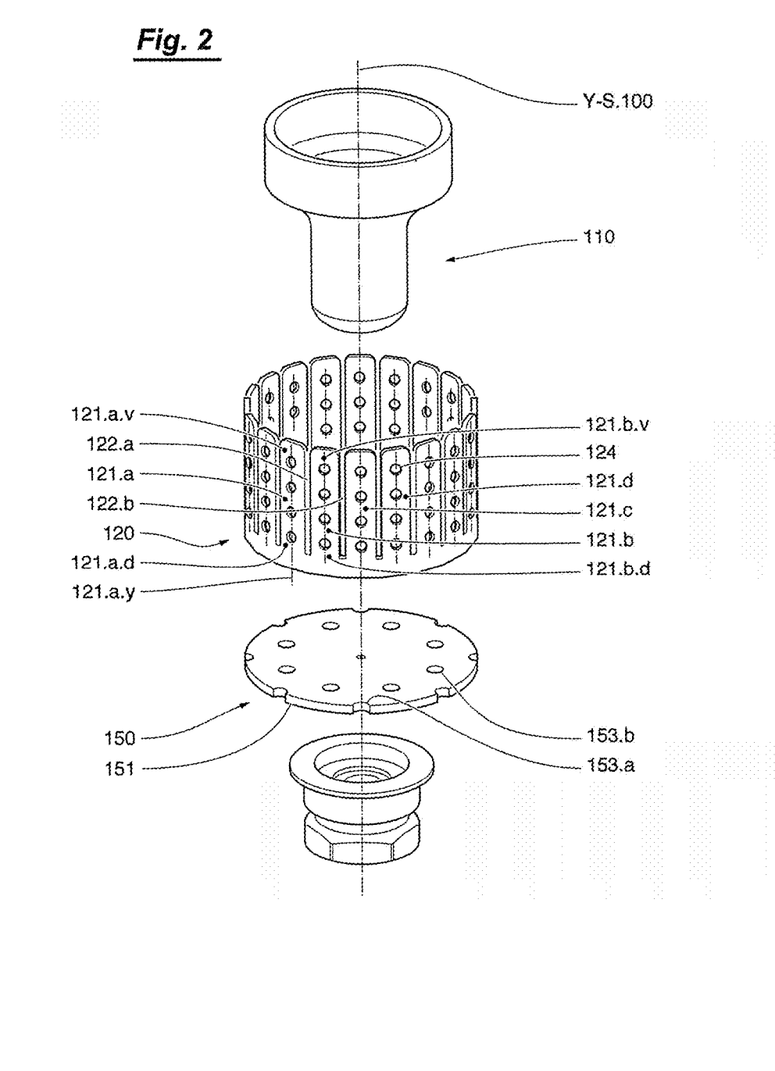
FIG. 2 is an exploded view from above downwards of the components relating to the first embodiment.
Figure 3:
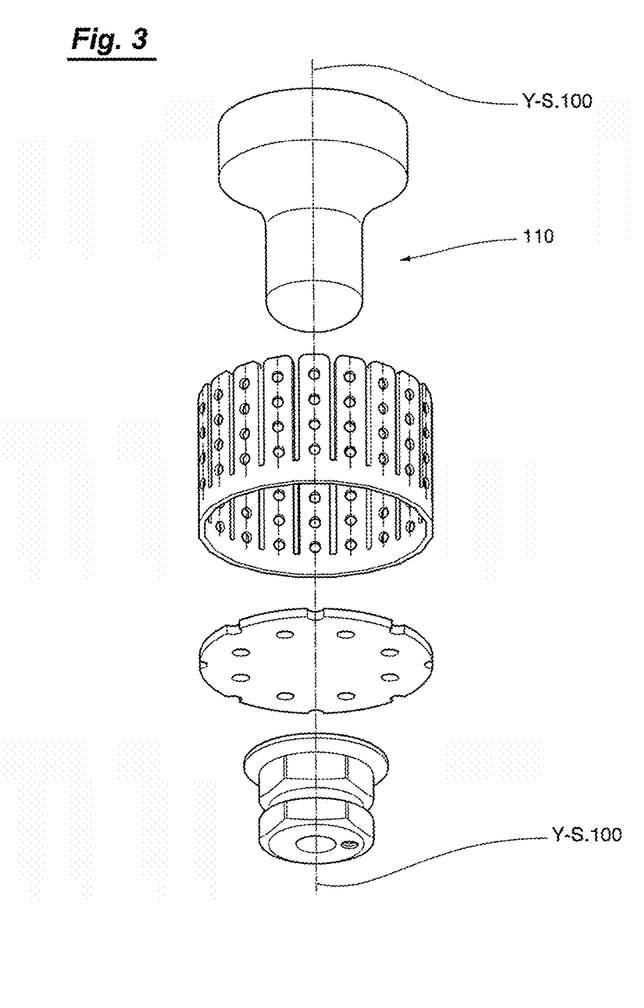
FIG. 3 is an exploded view from the bottom upwards of the components relating to the first embodiment.
Figure 4:
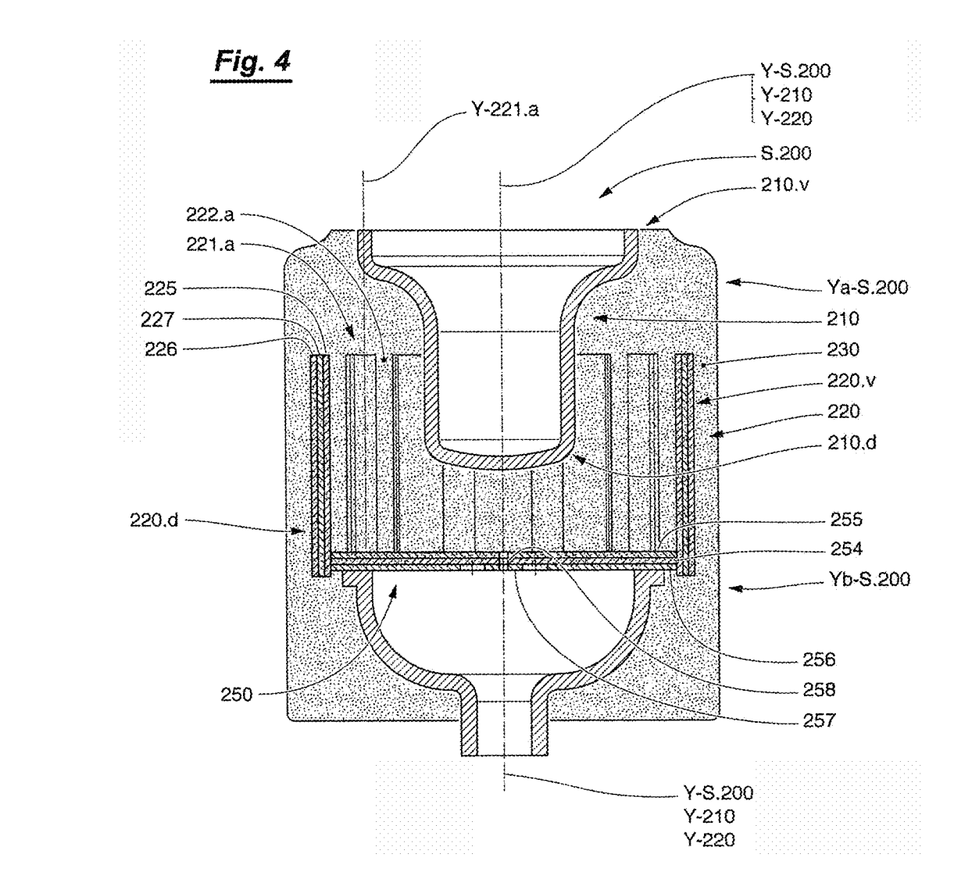
FIG. 4 shows schematically and in axial section a second embodiment of the construction system object of the present invention.
Figure 5:
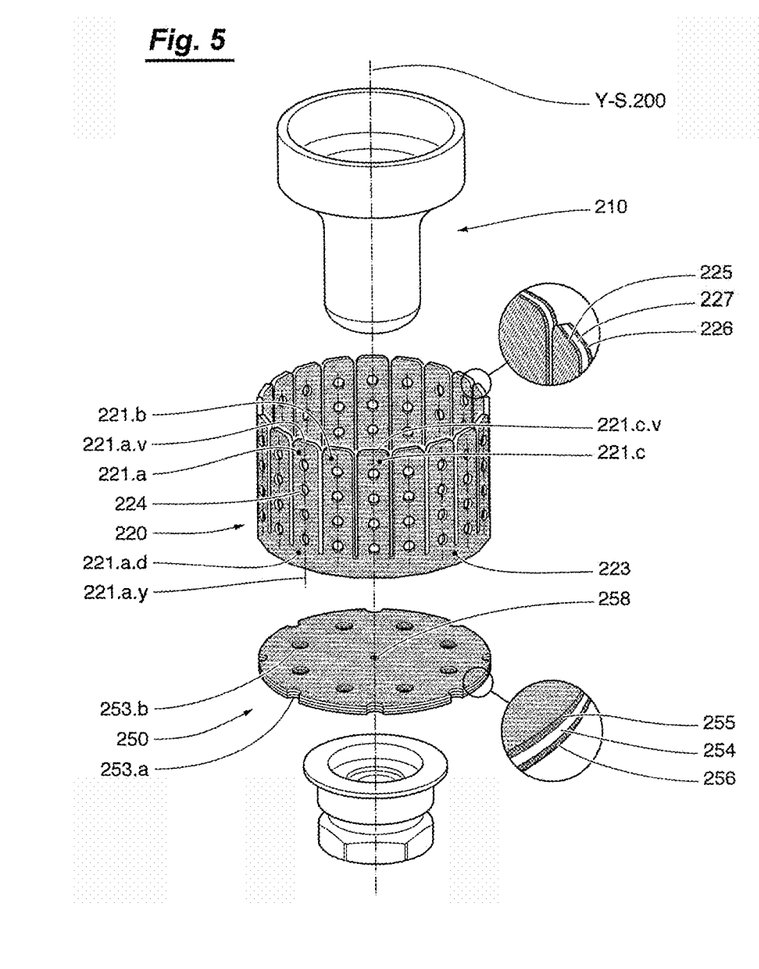
FIG. 5 is an exploded view from above downwards of the components relating to the second embodiment.
Figure 6:
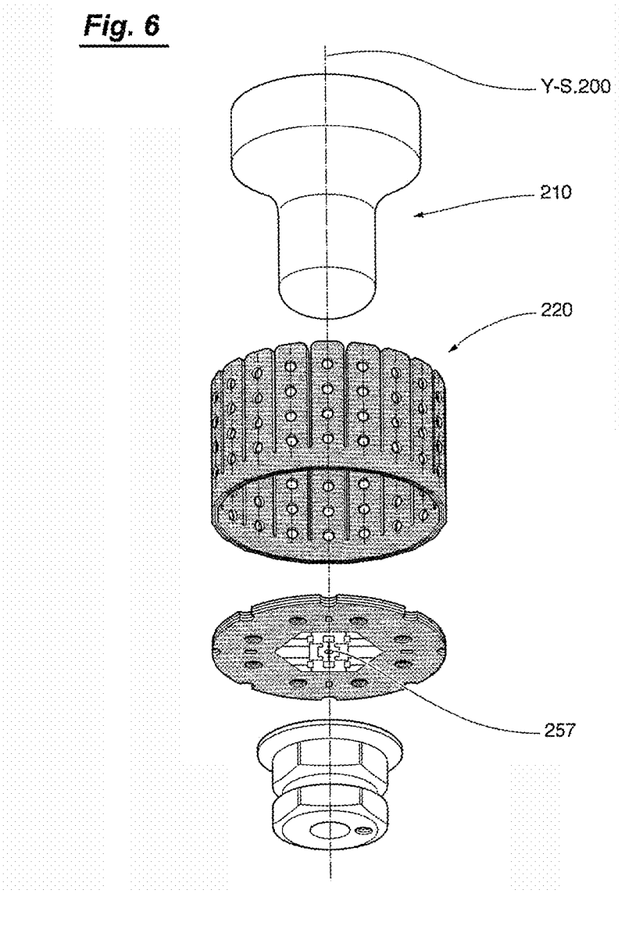
FIG. 6 is an exploded view from the bottom upwards of the components relating to the second embodiment.

With reference to the attached figures, a constructive system according to an embodiment of the present invention concerns a capacitive electric voltage sensor, indicated with S.100 in FIGS. 1, 2 and 3, and with S.200 in FIGS. 4, 5 and 6, in which said system extends axially along an axis Y_S.100/Y_S.200, defined longitudinal, configuring a first axial end portion, Ya_S.100/Ya_S.200, here defined for descriptive reasons as vicinal without limiting intent, and a second axial end portion, Yb_S.100/Yb_S.200, here defined for descriptive reasons as distal without limiting intent, in which said sensor extends transversely along a transverse axis X.

Said system substantially comprises: a first electrode 110/210 (made completely or partially with conductive material as better understood in the following), a second electrode 120/220 (made completely or partially with conductive material as better understood later), and a mass of dielectric insulating material, 130/230.

The first electrode 110/210 is positioned near said first axial end portion Ya_S.100/Ya_S.200 and preferably has an elongated shape which extends axially along its axis Y_110/Y 210 arranged coaxially with respect to the axis Y_S.100/Y_S.200 of the sensor S.100/S.200, in order to configure a first axial portion 110.v/210.v defined vicinal and a second axial portion 110.d/210.d defined distal and opposite with respect to the first axial portion 110.v/210.d.

The second electrode 120/220 has a tubular shape that extends longitudinally along a longitudinal axis thereof Y_120/Y_220 arranged coaxially with respect to the axis of the sensor Y_S.100/Y_S.200 of the sensor S.100/S.200. Said second electrode 120/220 is positioned around said first electrode 110/210, more particularly around the distal portion 110.d/210.d of said first electrode 110/210, and also said second electrode 120/220 configures a first axial portion 120.v/220.v defined vicinal and a second axial portion 120.d/220.d defined distal which is opposite with respect to said first axial portion 120.v/220.v.

With reference to the mass of dielectric insulating material 130/230, it is intended to at least partially enclose said first electrode 110/210 and said second electrode 120/220. The aforementioned first electrode 110/210 preferably has a funnel-like shape, with its distal portion 100.d/210.d lying within the vicinal portion 120.v/220.v of the tubular body defined by the second electrode 120/220.

With particular reference to the second electrode 120/220, it comprises a plurality of first elements, 121a, 121b, 121c, etc./221a/221b, 221c, etc., which have an axially elongated shape intended to define for each of them a vicinal axial end, 121a.v/221a.v, and a distal axial end 121a.d/221a.d.

These first elements 121a, 121b, etc./221a, 221b, etc. are arranged circumferentially side by side with each other, in order to configure a tubular body and, again these first elements 121a, 121b, etc./221a/221b, etc. are supported in a cantilevered manner, with their distal ends 121a.d/221a.d joined to each other by means of a circular ring 123/223 which acts as a support foot, so that the respective vicinal ends 121a.v/221b.v are free to oscillate (move) with a certain degree of freedom, in which said degree of freedom has a magnitude such as to allow said elements 121a, 121b, etc./221a, 221b, etc. cantilevered and more particularly supported by said respective vicinal ends 121a.v/221a.v to flex and/or move during the solidification steps of the resin used for forming the sensor, i.e. to follow the thermal extensions and contractions of the same resin during the casting and cooling phases of the same resin.

Again with reference to the attached figures, the system can further comprise a second element 150/250, wherein said second element 150/250 is positioned near the distal ends 121a.d, 121b.d, etc./221a.d, 221b.d, etc. of said plurality of first elements 121a, 121b, etc./221a, 221b, etc., as for example inside the circular ring 123/223 which acts as a support foot.

Preferably, said first elements 121a, 121b, etc./221a/221b, etc. are circumferentially spaced apart, in order to form openings 122a, 122b, etc./222a, 222b, etc., in which said openings have a width such as to allow the resin, in its liquid/pasty state, and therefore during the pouring thereof, to flow between said openings 122a, 122b, etc./222a, 222b, etc. from the outside towards the inside of the tubular body 120/220 as well as from the inside towards the outside of the same tubular body 120/220 and, therefore, allowing to the same resin to perfectly arrange itself around the individual elements. In this context, optionally, said first elements 121a, 121b, etc./221a, 221b, etc. can also be equipped with through holes 124/224. Preferably, said first elements 121a, 121b, etc./221a, 221b, etc. can be laminar elements having an elongated shape which extends along a respective longitudinal axis 121a.y/221a.y, in which the latter axis can be oriented parallel to the longitudinal axis Y_S.100/Y_S.200 of the sensor S. 100/S.200. In this context, this parallelism is a preferred but not a limiting characteristic.

Preferably, the distal ends 121a.d, 121b.d, etc./221a.d, 221b.d, etc. of said first elements 121a, 121b, etc./221a/ 221b, etc. are associated/constrained to the external perimeter 151/2510f said second element 150/250, and said second element 150/250 is preferably provided with through openings 154a, 153b/253a, 253b, near the external perimeter 151/251 (having a shape in the form of a half-moon) or within said external perimeter 151/251, for the same reasons as previously indicated with respect to the openings 124/ 224.

With particular reference to the figures, as also better described below, said second electrode 120/220 having a tubular shape and said second element 150/250 having a disc-like shape can form an electrode having the shape of a "glass/cup", in which said first elements 121a, 121b, etc./ 221a/221b, etc. form the tubular portion of said glass and in which the second element 150/250 forms the bottom portion of the same glass.

With reference to the system illustrated in FIGS. 1, 2 and 3, two different operating configurations can be implemented. To implement the first operating configuration, the first electrode 110 is connected to a voltage potential, such as for example a live bar by a conductive connection, in such a way that said first electrode 110 performs the function of source electrode 110 electric field generator. In this first configuration, the second electrode 120, positioned around said source electrode 110, acts as an electric field sensor electrode 120 and, more particularly, as an electric field sensor electrode 120 able to detect the electric field generated by said source electrode 110, wherein also the second element 150 is present, wherein said second element 150 can also act as an electric field sensor.

To implement the second operating configuration, the second electrode 120 is connected to a voltage potential, such as for example a live bar by a conductive connection, so that said second electrode 120 performs the function of source electrode electric field generator. In this second configuration, the first electrode 110, positioned within said source electrode 120, acts as an electric field sensor electrode and, more particularly, as an electric field sensor electrode able to detect the electric field generated by said source electrode 120.

With reference to FIGS. 4, 5, 6, 7 and 8, they illustrate a variant embodiment of the system object of the present invention, wherein, optionally, said first elements 221a, 221b, 221c, etc. comprise respective first laminae 227 in insulating material designed to form a self-supporting support structure and respective first thin layers 225 of conductive material applied on the respective inner surfaces of said first laminae 227, wherein the set of the various layers 225 made of conductive material of the various first elements 221a, 221b, 221c, etc. form the second electrode 220_225 having a tubular shape.

Optionally, said first elements 221a, 221b, 221c, etc. may further comprise respective second thin layers 226 of conductive material applied on the outer surface of said first sheets 224, electrically insulated with respect to the first thin layers 225 and preferably connected to ground, in which the set of the various layers 226 form an electromagnetic screen, having tubular form, which is adapted to prevent electric field lines external to the sensor 5_200, such as for example electric field lines generated by conductors arranged nearby, to close on the first internal electrode 210 or on the second electrode 220_225, in such a way that the capacitive coupling between the first electrode 210 and the second electrode 220_225 is immune to the external electric fields.

FIGS. 4, 5, 6, 7 and 8 illustrate a variant embodiment of the system object of the present invention in which said second element 250 comprises a first lamina 254 made of insulating material stretched to form a self-supporting supporting structure and a first thin layer of conductive material 255 applied to the inner surface of said first lamina 254, wherein said first thin layer 255 of conductive material is stretched to form a further component for second electrode 220 of the capacitive sensor S_200, for example electrically connecting said inner/upper layer 255 with the first conductive inner layer 225 of the second electrode 220.

Optionally, said second element 250 may further comprise a second thin layer 256 of conductive material (preferably connected to ground) applied on the outer surface of said first lamina 254 and electrically insulated with respect to the first thin layer 255, stretched to form an electromagnetic shield adapted to prevent to the electric field lines external to the sensor S_200 (such as for example electric field lines generated by conductors arranged nearby) to close on the first internal electrode 210 or on the second electrode 220_225, so that the capacitive coupling between the first central electrode 210 and the second tubular electrode 210_225 is immune to external electric fields.

Figures 7, 8:
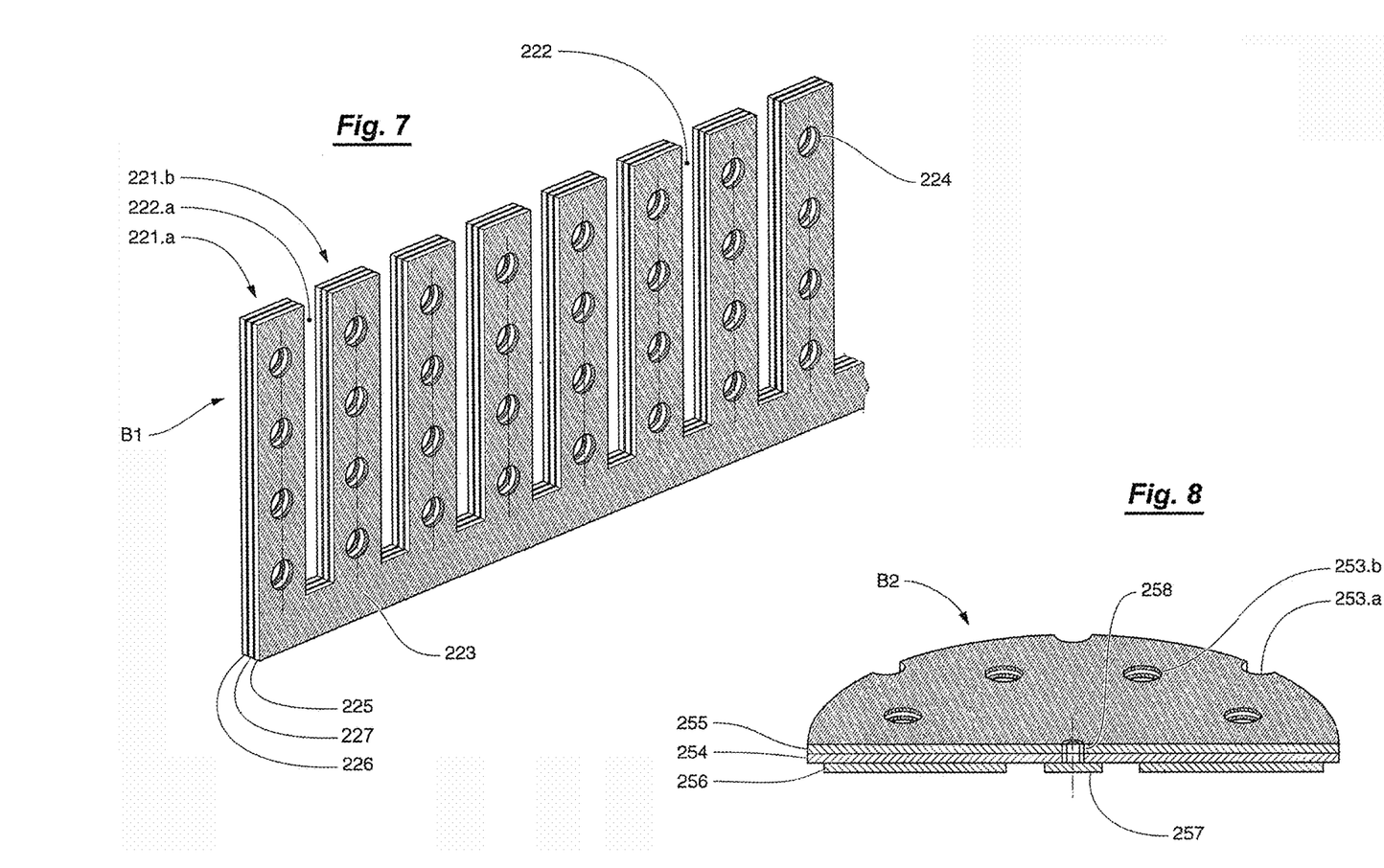
FIG. 7 illustrates schematically a constructive detail of the second embodiment.
FIG. 8 schematically illustrates a construction detail of the second embodiment.

With reference to FIG. 7 it illustrates a flat coppered base B1 which can be rolled up, comprising a base 223 and "petals" 221a, 221b, etc., in which the said base B1 is able to form the second electrode 220 having a tubular shape.

The flat base B1 comprises a first lamina 227 of insulating material intended to form a self-supporting support structure and a first thin layer 225 of conductive material applied on the inner surface of said first lamina 227, in such a way that by wrapping said base B1 in the manner of a ring with the first layer 225 inside the second electrode 220 is obtained.

Optionally, if desirable, said base B1 may also comprise a second thin layer 226 of conductive material applied to the outer surface of said first lamina 227, wherein said second thin layer 226 is electrically insulated with respect to the first thin layer 225, in order to form, throughout the winding in the form of a ring as aforesaid, an electromagnetic shield having a tubular shape in relation to the second electrode 220 as specified above.

With reference to FIG. 8, the second element 250 can also be obtained by means of a copper-plated base B2, comprising a first lamina 254 made of insulating material intended to form a self-supporting supporting structure and a first thin layer 255 of conductive material applied to the inner/upper surface of said first lamina 254, in which said first thin layer 255 of conductive material is stretched to form a further component for the second electrode 220 as aforesaid.

Optionally, said second element 250 may further comprise a second thin layer 256 of conductive material applied to the outer/lower surface of said first lamina 254, wherein said second layer 256 is electrically insulated with respect to the first layer 255, as well as a third layer of conductive material 257, applied on the outer/lower face of said lamina 254, electrically isolated with respect to the second layer 256, wherein said third layer 257 is connected by one or more "via" 258 with the first (inner and upper) layer 255 of conductive material.

With reference to the above description the capacitive sensor S_200 can provide a first and a second operative configuration.

With reference to the first operating configuration, said first electrode 210 can act as a source electrode and the second electrode 220, more particularly the inner conductive layer 225 (and also the optional inner conductive layer 255 of the second element 250) can perform the function of an electric field sensor electrode adapted to detect the electric field emitted by the first electrode 210.

With reference to the second operating configuration, said second electrode 220, more particularly the inner conductive layer 225 (and also the optional internal conductive layer 255 of the second element 250) can perform the function of an electric field source electrode and said first electrode 210 can act as an electric field sensor electrode able to detect the electric field emitted by the second electrode 220 (i.e. from the layer 225 and/or the layer 255).

The description of the various embodiments of the constructive system for a capacitive sensor is given purely by way of an example without limiting, and therefore all the modifications or variants suggested by the practice and/or falling within the scope of the following claims can be applied to said system. The following claims are also an integrative part for the above description.

What is claimed is:

1. A capacitive voltage sensor assembly comprising:
an electrode extending along a longitudinal axis;
a tubular section extending along the longitudinal axis and at least partially surrounding the electrode such that the tubular section is radially spaced from the electrode, the tubular section including
a first layer made of an electrically insulating material, the first layer having a first plurality of through openings comprising a first row of circumferentially spaced through openings and a second row of circumferentially spaced through openings and each through opening of the first row is aligned with a through opening of the second row in a direction parallel to the longitudinal axis,
a second layer made of an electrically conductive material disposed on an inner surface of the first layer, the second layer having a second plurality of through openings comprising a first row of circumferentially spaced through openings and a second row of circumferentially spaced through openings and each through opening of the first row is aligned with a through opening of the second row in a direction parallel to the longitudinal axis, and
a third layer made of an of electrically conductive material disposed on an outer surface of the first layer, the third layer having a third plurality of through openings comprising a first row of circumferentially spaced through openings and a second row of circumferentially spaced through holes and each through opening of the first row is aligned with a through opening of the second row in a direction parallel to the longitudinal axis; and
a mass of dielectric material at least partially enclosing the electrode and the tubular section, wherein the mass of dielectric insulating material fills through openings in the tubular section,
wherein each through opening of the second plurality of through openings is circumferentially aligned with a through opening of the third plurality of through openings.

2. The capacitive voltage sensor assembly of claim 1, wherein each through opening of the first plurality of through openings is circumferentially aligned with a through opening of the second plurality of through openings and with a through opening of the third plurality of through openings.

3. The capacitive voltage sensor assembly of claim 1, wherein the electrode is configured to be connected to a source voltage, and wherein the second layer is an electric field sensor configured to form a capacitive coupling with the electrode.

4. The capacitive voltage sensor assembly of claim 1, wherein the electrode includes a first portion having a first diameter transverse to the longitudinal axis and a second portion that extends from the first portion, wherein the second portion has a second diameter transverse to the longitudinal axis, and wherein the first diameter is greater than the second diameter.

5. The capacitive voltage sensor assembly of claim 1, wherein the tubular section is flexible.

6. The capacitive voltage sensor assembly of claim 1, wherein the tubular section is configured to flex during solidification of the mass of dielectric insulating material.

7. The capacitive voltage sensor assembly of claim 1, wherein the tubular section is configured such that it can be rolled into a tube-shape.

8. The capacitive voltage sensor assembly of claim 1, wherein the first layer is a self-supporting structure.

9. The capacitive voltage sensor assembly of claim 1, further comprising a support structure adjacent an open end of the tubular section.

10. The capacitive voltage sensor assembly of claim 9, wherein the support structure extends radially inwardly toward the electrode.

11. The capacitive voltage sensor assembly of claim 1, wherein a first axial end of the tubular section is open, and a second opposite axial end of the tubular section is closed.

12. The capacitive voltage sensor assembly of claim 1, wherein a size of each through opening of the first plurality of through openings is equal to a size of each through opening of the second plurality of through openings and to a size of each through opening of the third plurality of through openings.

13. The capacitive voltage sensor assembly of claim 1, wherein a size of each through opening of the second plurality of through openings is equal to a size of each through opening of the third plurality of through openings.

14. A capacitive voltage sensor assembly comprising:
an electrode extending along a longitudinal axis;
a tubular section extending along the longitudinal axis and at least partially surrounding the electrode such that the tubular section is radially spaced from the electrode, the tubular section including
a first layer made of an electrically insulating material, the first layer having a first plurality of slits circumferentially spaced around the tubular section, wherein each slit of the first plurality of slits extends in a direction parallel to the longitudinal axis,
a second layer made of an electrically conductive material disposed on an inner surface of the first layer, the second layer having a second plurality of slits circumferentially spaced around the tubular section, wherein each slit of the second plurality of slits extends in a direction parallel to the longitudinal axis, and
a third layer made of an of electrically conductive material disposed on an outer surface of the first layer, the third layer having a third plurality of slits circumferentially spaced around the tubular section, wherein each slit of the third plurality of slits extends in a direction parallel to the longitudinal axis; and
a mass of dielectric material at least partially enclosing the electrode and the tubular section, wherein the mass of dielectric insulating material fills slits in the tubular section, wherein each slit of the second plurality of slits is circumferentially aligned with a slit of the third plurality of slits.

15. The capacitive voltage sensor assembly of claim 14, wherein each slit of the first plurality of slits is circumferentially aligned with a slit of the second plurality of slits and with a slit of the third plurality of slits.

16. The capacitive voltage sensor assembly of claim 14, wherein a size of each slit of the second plurality of slits is equal to a size of each slit of the third plurality of slits.

17. A capacitive voltage sensor assembly comprising:
a source electrode extending along a longitudinal axis;
a tubular section extending along the longitudinal axis and at least partially surrounding the source electrode such that the tubular section is radially spaced from the source electrode, the tubular section including
a first layer made of an electrically insulating material, the first layer having a first plurality of through openings,
a second layer made of an electrically conductive material disposed on an inner surface of the first layer, the second layer having a second plurality of through openings, wherein the second layer is configured to form a capacitive coupling with the source electrode, and
a shield configured to shield the capacitive coupling from external electric fields; and
a mass of dielectric material at least partially enclosing the source electrode and the tubular section,
wherein each through opening of the first plurality of through openings is aligned with a through opening of the second plurality of through openings.

18. The capacitive voltage sensor assembly of claim 17, wherein the tubular section is flexible.

19. The capacitive voltage sensor assembly of claim 17, wherein the tubular section includes a plurality of cantilevered tabs.

20. The capacitive voltage sensor assembly of claim 17, wherein the shield is defined by a third layer made of an electrically conductive material disposed on an outer surface of the first layer, and wherein the third layer includes a third plurality of through openings.

* * * * *